(12) United States Patent
Kim (10) Patent No.: US 10,043,789 B2
(45) Date of Patent: Aug. 7, 2018

(54) SEMICONDUCTOR PACKAGES INCLUDING AN ADHESIVE PATTERN

(71) Applicant: Youngbae Kim, Seoul (KR)

(72) Inventor: Youngbae Kim, Seoul (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 15/454,253

(22) Filed: Mar. 9, 2017

(65) Prior Publication Data

US 2018/0061816 A1 Mar. 1, 2018

(30) Foreign Application Priority Data

Aug. 26, 2016 (KR) .................. 10-2016-0109260

(51) Int. Cl.
| | |
|---|---|
| *H01L 25/18* | (2006.01) |
| *H01L 25/065* | (2006.01) |
| *H01L 23/31* | (2006.01) |
| *H01L 23/00* | (2006.01) |
| *H01L 23/367* | (2006.01) |

(52) U.S. Cl.
CPC .......... *H01L 25/18* (2013.01); *H01L 23/3128* (2013.01); *H01L 23/3675* (2013.01); *H01L 24/17* (2013.01); *H01L 24/32* (2013.01); *H01L 24/49* (2013.01); *H01L 24/73* (2013.01); *H01L 25/0657* (2013.01); *H01L 2224/16113* (2013.01); *H01L 2224/16227* (2013.01); *H01L 2224/17135* (2013.01); *H01L 2224/32145* (2013.01); *H01L 2224/32225* (2013.01); *H01L 2224/33134* (2013.01); *H01L 2224/48091* (2013.01); *H01L 2224/48106* (2013.01); *H01L 2224/48227* (2013.01);

(Continued)

(58) Field of Classification Search
CPC ............ H01L 25/043; H01L 25/00657; H01L 25/0074; H01L 25/0756; H01L 25/117; H01L 23/28–23/3192; H01L 23/31; H01L 23/3157; H01L 23/3171; H01L 23/3185; H01L 24/10; H01L 24/17; H01L 2224/17135; H01L 2224/28; H01L 2224/29; H01L 2224/29012; H01L 2224/29013; H01L 2224/29023; H01L 2224/29035
See application file for complete search history.

(56) References Cited

U.S. PATENT DOCUMENTS 7,279,789 B2 10/2007 Cheng
9,064,781 B2 6/2015 Zhao et al.
(Continued)

FOREIGN PATENT DOCUMENTS

KR 2007/0034200 A 3/2007
KR 101374144 B1 3/2014

*Primary Examiner* — Scott B Geyer
(74) *Attorney, Agent, or Firm* — Harness, Dickey & Pierce, P.L.C.

(57) ABSTRACT

A semiconductor package is disclosed. The semiconductor package comprises a lower package including a first substrate and a semiconductor chip on the first substrate, a second substrate on the lower package, interconnect terminals between the first substrate and the second substrate, and an adhesive pattern between a top surface of the semiconductor chip and a bottom surface of the second substrate. The adhesive pattern extends along an edge of the semiconductor chip. The adhesive pattern exposes a top surface of a central zone of the semiconductor chip.

20 Claims, 8 Drawing Sheets

(52) U.S. Cl.
CPC ............... *H01L 2224/73253* (2013.01); *H01L 2224/73265* (2013.01); *H01L 2225/0651* (2013.01); *H01L 2225/0652* (2013.01); *H01L 2225/06517* (2013.01); *H01L 2225/06548* (2013.01); *H01L 2225/06568* (2013.01); *H01L 2225/06572* (2013.01); *H01L 2225/06586* (2013.01); *H01L 2225/06589* (2013.01); *H01L 2924/1431* (2013.01); *H01L 2924/1434* (2013.01); *H01L 2924/15311* (2013.01); *H01L 2924/3512* (2013.01)

(56) References Cited

U.S. PATENT DOCUMENTS

| | | | | |
|---|---|---|---|---|
| 9,070,627 | B2* | 6/2015 | Zhao | H01L 24/29 |
| 9,082,743 | B2* | 7/2015 | Hung | H01L 23/3675 |
| 2005/0269676 | A1* | 12/2005 | Lee | H01L 24/27 |
| | | | | 257/678 |
| 2012/0199981 | A1 | 8/2012 | Jeong et al. | |
| 2012/0241925 | A1* | 9/2012 | Yoon | H01L 21/563 |
| | | | | 257/666 |
| 2013/0105989 | A1* | 5/2013 | Pagaila | H01L 21/56 |
| | | | | 257/774 |
| 2013/0292848 | A1* | 11/2013 | Na | H01L 23/5226 |
| | | | | 257/774 |
| 2015/0162265 | A1 | 6/2015 | Jo et al. | |
| 2015/0249061 | A1* | 9/2015 | Zhao | H01L 24/29 |
| | | | | 257/737 |
| 2015/0364455 | A1* | 12/2015 | Crobu | G01L 19/0084 |
| | | | | 257/417 |
| 2016/0027764 | A1* | 1/2016 | Kim | H01L 24/97 |
| | | | | 257/686 |
| 2016/0095220 | A1 | 3/2016 | Karhade et al. | |

* cited by examiner

SEMICONDUCTOR PACKAGES INCLUDING AN ADHESIVE PATTERN

CROSS-REFERENCE TO RELATED APPLICATIONS

This U.S. nonprovisional patent application claims priority under 35 U.S.C. § 119 Korean Patent Application 10-2016-0109260, filed on Aug. 26, 2016, the entire contents of which are hereby incorporated by reference.

BACKGROUND

Inventive concepts relates to a semiconductor package and, more particularly, to a semiconductor package having a package-on-package structure.

In the semiconductor industry, high capacity, compactness, and small size of semiconductor devices and electronic products using the same have been increasingly demanded. Various package technologies have been developed to satisfy the above demands. One approach of the various package technologies is a packaging technology which vertically stacks a plurality of semiconductor chips to achieve a high density chip stacking. This packaging technology may integrate semiconductor chips having various functions on a small area in comparison to a conventional package consisting of one semiconductor chip.

However, packaging technologies which stack a plurality of semiconductor chips may have a relatively lower yield than a single chip packaging technology. As one solution to overcome the yield drop and achieve the high density chip stacking, it has been suggested a package-on-package (POP) technology in which a package is stacked on other package.

Since the semiconductor packages for the POP technology are determined acceptable through test, a defect rate may drop in end products. Such POP type semiconductor packages may be used for the miniaturization of electronic portable devices and the functional diversification of mobile products.

SUMMARY

Some example embodiments of inventive concepts relate a semiconductor package having improved reliability.

Features and characteristics of inventive concepts are not limited to those mentioned above, other features and characteristics which have not been mentioned above will be clearly understood to those skilled in the art from the following description.

According to some example embodiments of inventive concepts, a semiconductor package may include a lower package including a first substrate and a semiconductor chip on the first substrate, a second substrate on the lower package, interconnect terminals between the first substrate and the second substrate, and an adhesive pattern between a top surface of the semiconductor chip and a bottom surface of the second substrate. The adhesive pattern may extend along an edge of the semiconductor chip. The adhesive pattern may expose a top surface of a central zone of the semiconductor chip.

According to some example embodiments of inventive concepts, a semiconductor package may include a first package including a first substrate and a semiconductor chip on the first substrate, a second substrate on the semiconductor chip, interconnect terminals between the first substrate and the second substrate, and adhesive patterns between a top surface of the semiconductor chip and a bottom surface of the second substrate. The adhesive patterns may face each other. Each of the adhesive patterns may include a first portion and a second portion. The first portion may extend in a first direction along an edge of the semiconductor chip. The second portion may extend in a second direction from an end of the first portion along the edge of the semiconductor chip. The second direction may cross the first direction.

According to some example embodiments of inventive concepts, a semiconductor package may include a first substrate, a first semiconductor chip on a top surface of the first substrate, a plurality of interconnect terminals on the top surface of the first substrate, an adhesive pattern on a top surface of the first semiconductor chip, and a second substrate on top of the adhesive pattern and the plurality of interconnect terminals. The plurality of interconnect terminals may be arranged around the first semiconductor chip in a plan view. The adhesive pattern may extend along on at least part of an edge of the first semiconductor chip such that the adhesive pattern does not cover a central portion of the top surface of the semiconductor chip.

DETAILED DESCRIPTION

Figure 1:
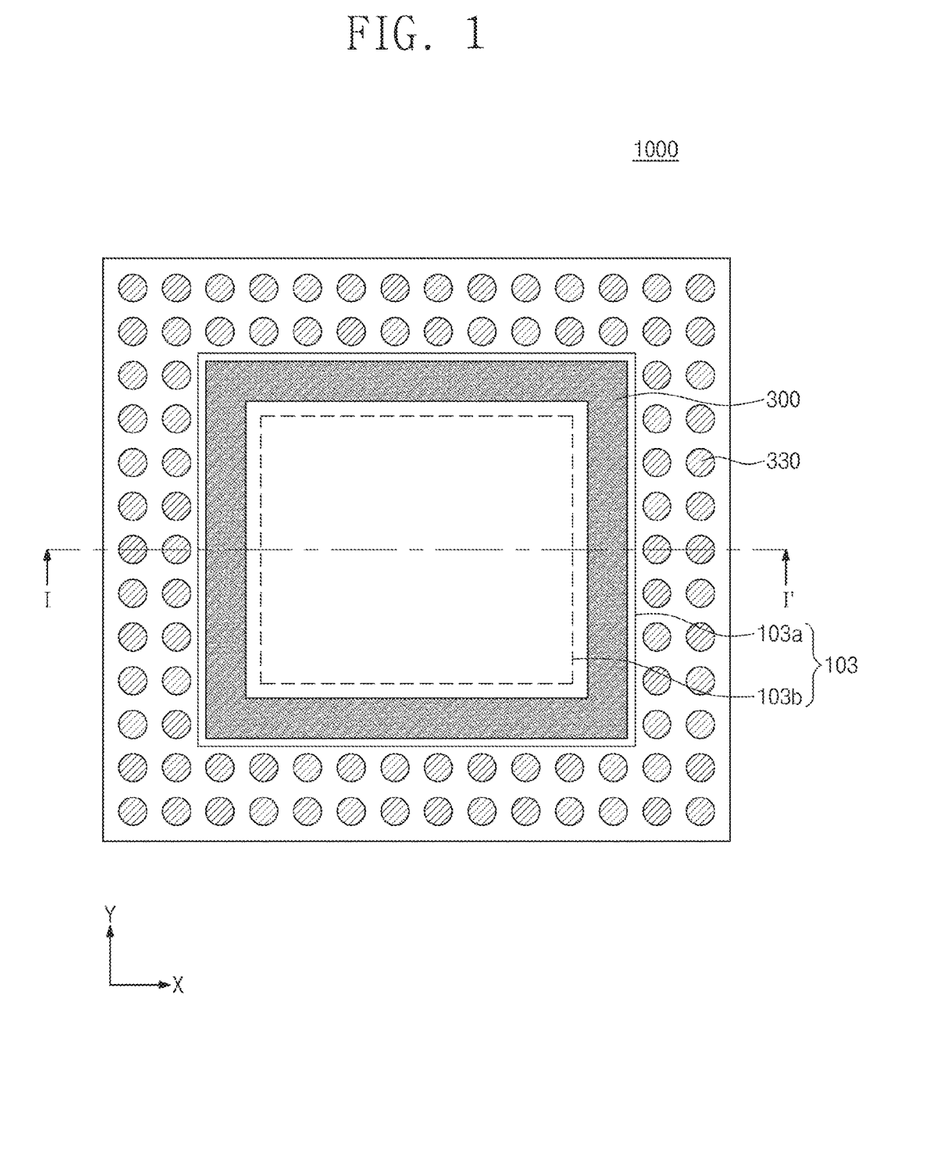
FIG. 1 is a plan view illustrating a semiconductor package according to some example embodiments of inventive concepts.
Figure 2:
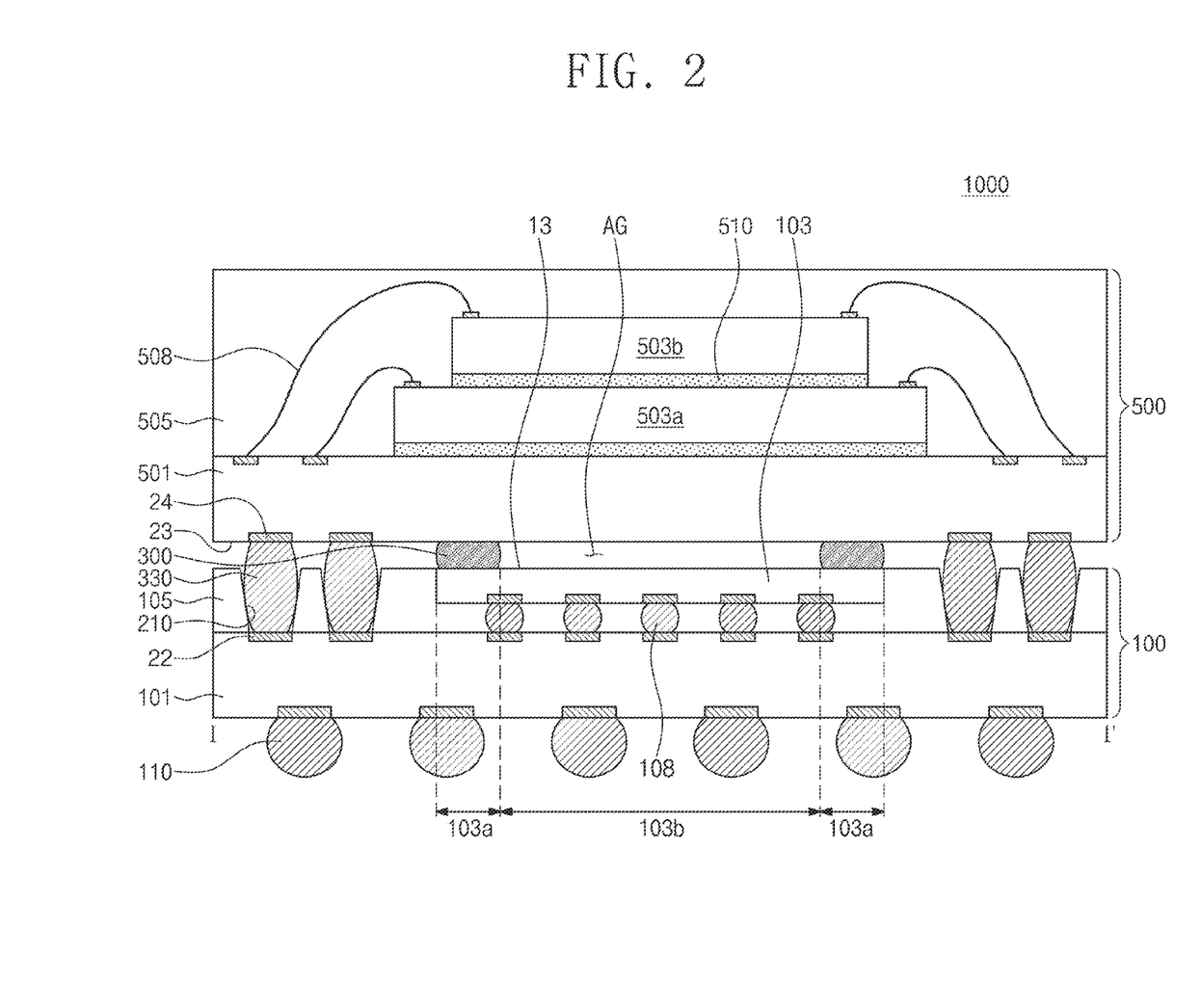
FIG. 2 is a cross-sectional view taken along line I-I' of FIG. 1, illustrating a semiconductor package according to some example embodiments inventive concepts.

FIG. 1 is a plan view illustrating a semiconductor package according to some example embodiments of inventive concepts. FIG. 2 is a cross-sectional view taken along line I-I' of FIG. 1, illustrating a semiconductor package according to some example embodiments of inventive concepts.

Referring to FIGS. 1 and 2, a semiconductor package 1000 may include a lower package 100, an upper package 500, an adhesive pattern 300, and interconnect terminals 330.

The lower package 100 may include a lower substrate 101, a lower semiconductor chip 103, a lower molding layer 105, and chip interconnections 108.

The lower substrate 101 may be a printed circuit board (PCB). For example, the lower substrate 101 may include a plurality of insulation layers (not shown) and internal interconnect lines (not shown) between the insulation layers. The lower semiconductor chip 103 may be mounted on a top surface of the lower substrate 101. The lower semiconductor chip 103 may be disposed on a central zone of the lower substrate 101. The lower semiconductor chip 103 may be mounted on the top surface of the lower substrate 101 in a flip-chip bonding manner. The lower semiconductor chip 103 may be, for example, a semiconductor logic chip. The chip interconnections 108 may be interposed between the lower substrate 101 and the lower semiconductor chip 103. The chip interconnections 108 may electrically connect the lower substrate 101 and the lower semiconductor chip 103 to each other. The chip interconnections 108 may include, for example, a solder ball.

The lower molding layer 105 may be disposed on the lower substrate 101. The lower molding layer 105 may cover sidewalls and a bottom surface of the lower semiconductor chip 103 and expose a top surface 13 of the lower semiconductor chip 103. The lower molding layer 105 may be disposed in a space between the lower semiconductor chip 103 and the lower substrate 101 and thus hold the chip interconnections 108 in position. Alternatively, as not shown in figures, the lower molding layer 105 may be placed with an under-fill resin provided between the lower substrate 101 and the lower semiconductor chip 103. The lower package 100 may further include outer terminals 110. The outer terminals 110 may be disposed on a bottom surface of the lower substrate 101 and electrically connected to the lower semiconductor chip 103. The outer terminals 110 may include, for example, a solder ball.

The upper package 500 may be stacked on the lower package 100. The upper package 500 may include an upper substrate 501, upper semiconductor chips 503a and 503b, an upper molding layer 505, and bonding wires 508.

The upper substrate 501 may be a printed circuit board (PCB). For example, the upper substrate 501 may include a plurality of insulation layers (not shown) and internal interconnect lines (not shown) between the insulation layers. The upper semiconductor chips 503a and 503b may be sequentially mounted on a top surface of the upper substrate 501. The upper semiconductor chips 503a and 503b may be disposed on a central zone of the upper substrate 501. The upper semiconductor chips 503a and 503b may include a first upper semiconductor chip 503a and a second upper semiconductor chip 503b. An adhesive film 510 may be provided to adhere the first upper semiconductor chip 503a to the top surface of the upper substrate 501, and other adhesive film 501 may be provided to adhere the second upper semiconductor chip 503b to a top surface of the first upper semiconductor chip 503a. The number of the upper semiconductor chips may be, but not limited to that illustrated in figures, one or more than two. The lower semiconductor chip 103 and the upper semiconductor chips 503a and 503b may be of the same kind but have different areas. For example, the upper semiconductor chips 503a and 503b may be a semiconductor logic chip. Alternatively, the lower semiconductor chip 103 and the upper semiconductor chips 503a and 503b may be different from each other in terms of kind, structure, and/or area. For example, the upper semiconductor chips 503a and 503b may be a semiconductor memory chip.

The bonding wires 508 may electrically connect the upper semiconductor chips 503a and 503b to the upper substrate 501. The upper molding layer 505 may be disposed on the upper substrate 501. The upper molding layer 505 may cover the upper semiconductor chips 503a and 503b. Respective ends of the bonding wires 508 may be connected to contacts on the upper substrate 501, and upper semiconductor chips 503a and 503b.

Interconnect terminals 330 may be disposed between the upper package 500 and the lower package 100. The interconnect terminals 330 may be in contact with lower pads 22, which are provided on the top surface of the lower substrate 101, and upper pads 24, which are provided on a bottom surface 23 of the upper substrate 501. The interconnect terminals 330 may electrically connect between the lower package 100 and the upper package 500. The lower and upper packages 100 and 500 may be combined with one another by the interconnect terminals 330. The interconnect terminals 330 may be provided in through holes 210 formed in the lower molding layer 105. The interconnect terminals 330 may surround the lower semiconductor chip 103 and be arranged in first and second directions X and Y.

An adhesive pattern 300 may be interposed between the top surface 13 of the lower semiconductor chip 103 and the bottom surface 23 of the upper substrate 501. The adhesive pattern 300 may have a line shape, on the top surface 13 of the lower semiconductor chip 103, that extends along an edge 103a of the lower semiconductor chip 103. The adhesive pattern 300 may expose the top surface 13 of a central zone 103b of the lower semiconductor chip 103. The adhesive pattern 300 may be spaced apart from a top surface of the lower molding layer 105. The adhesive pattern 300 may have a closed-loop shape or a ring shape. The adhesive pattern 300 may be formed of a material whose modulus is high enough to firmly hold together the lower and upper packages 100 and 500. The adhesive pattern 300 may include, for example, an NCP (Non-Conductive Paste), an NCF (Non-Conductive Film), an ACF (Anisotropic Film), a UV film, a super glue, a thermosetting glue, a laser-curable glue, or an ultrasonic-curable glue. For example, when the adhesive pattern 300 is formed of a liquid material, the adhesive pattern 300 may have convex sidewalls. The adhesive pattern 300 may define an air gap AG provided between the lower semiconductor chip 103 and the upper substrate 501.

In case that the lower and upper packages 100 and 500 include different kinds of semiconductor chips, the lower and upper packages 100 and 500 may have different thermal expansion coefficients from each other. In case that an area of the lower semiconductor chip 103 occupied in the total area of the lower package 100 is different from an area of the upper semiconductor chips 503a and 503b occupied in the total area of the upper package 500, the lower and upper packages 100 and 500 may also have different thermal expansion coefficients from each other. The adhesive pattern 300 may be formed between the lower and upper packages 100 and 500 to limit and/or prevent the interconnect terminals 330 from being cracked due to the difference of the thermal expansion coefficients between the lower and upper packages 100 and 500. The adhesive pattern 300 may fasten the lower and upper packages 100 and 500 to each other, and thus may serve to reduce and/or minimize stress applied to the interconnect terminals 330.

However, in case that a large amount of the adhesive pattern 300 is formed on the top surface 13 of the lower semiconductor chip 103, the adhesive pattern 300 may flow into the through hole 210 of the lower molding layer 105 to cause contact failure between the interconnect terminals 330 and the lower pads 22. According to some example embodiments of inventive concepts, the adhesive pattern 300 may be formed along the edge 103a of the lower semiconductor chip 103 while exposing the top surface 13 of the central zone 103b of the lower semiconductor chip 103 so as to effectively fasten the lower and upper packages 100 and 500 to each other as well as to use a small amount of the adhesive pattern 300 on the top surface 13 of the lower semiconductor chip 103. As such, because a small amount of the adhesive pattern 300 is used to fasten the lower and upper packages 100 and 500 to each other without contact failure, it may be possible to reduce and/or minimize stress applied to the interconnect terminals 300.

Figure 3:
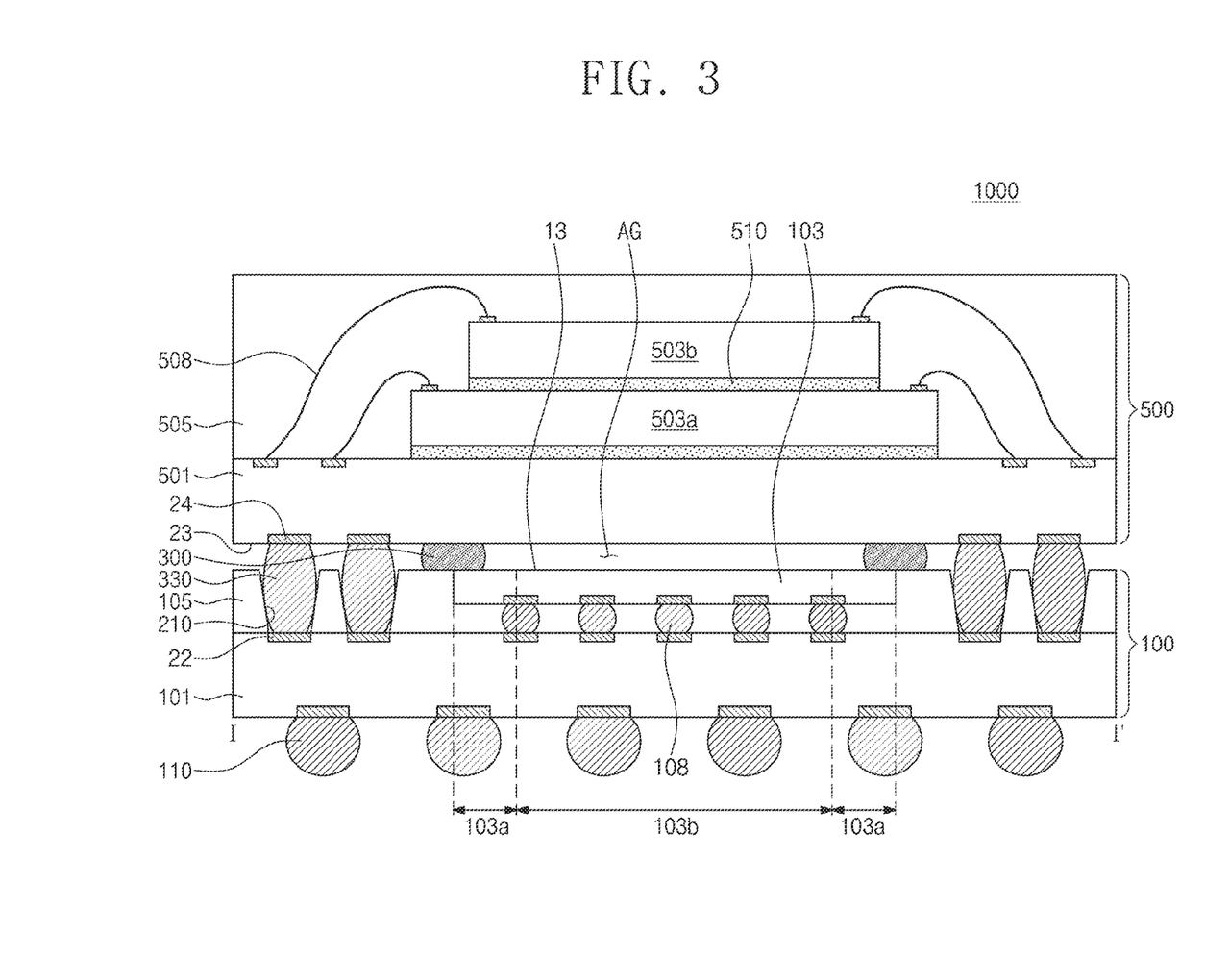
FIG. 3 is a cross-sectional view taken along line I-I' of FIG. 1, illustrating a semiconductor package according to some example embodiments of inventive concepts.

FIG. 3 is a cross-sectional view taken along line I-I' of FIG. 1, illustrating a semiconductor package according to some example embodiments of inventive concepts. For brevity of the description, components substantially the same as those in FIGS. 1 and 2 are allocated the same reference numerals thereto, and a detailed description thereof may be omitted.

Referring to FIG. 3, the adhesive pattern 300 may be in partial contact with the top surface of the lower molding layer 105 and spaced apart from the interconnect terminals 330.

Figure 4:
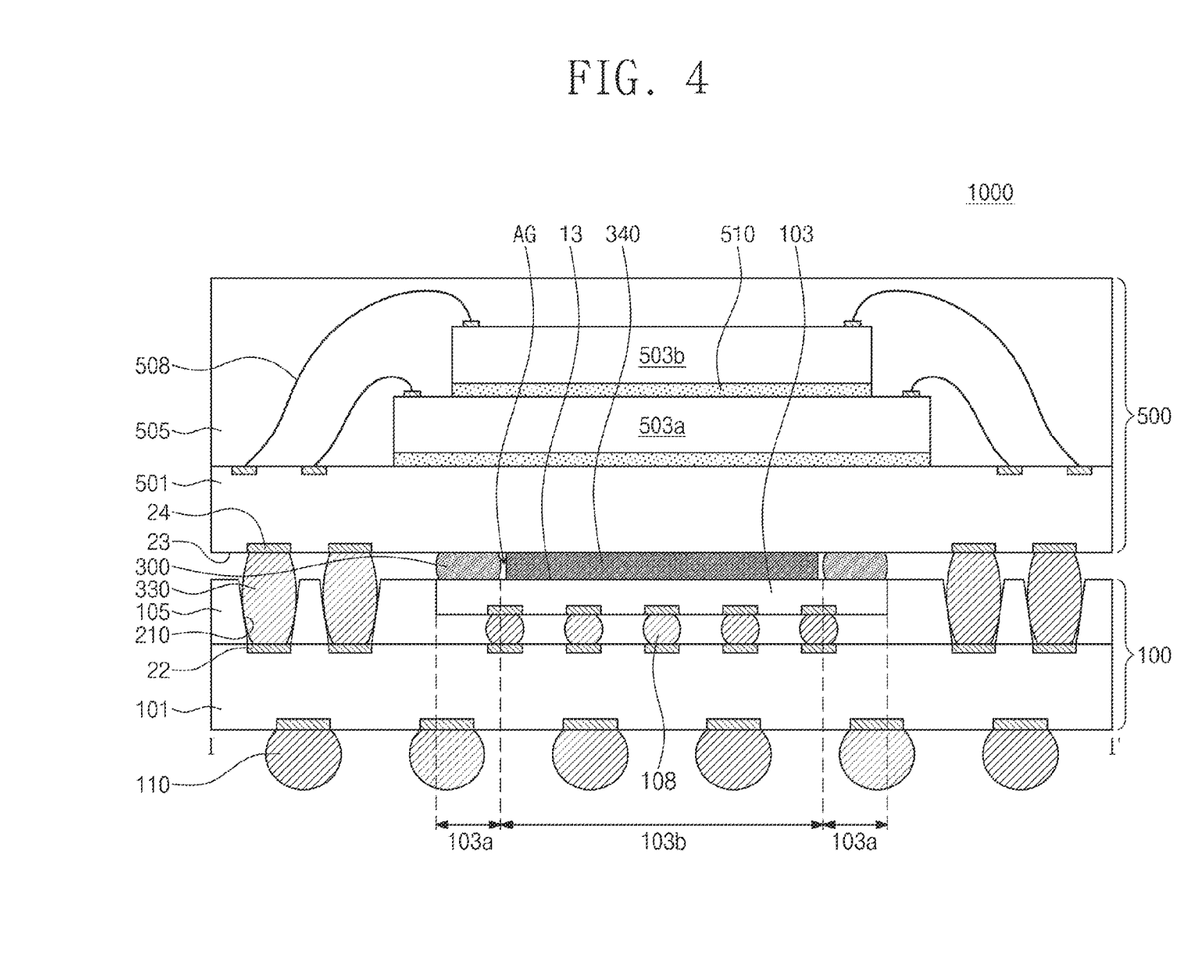
FIG. 4 is a cross-sectional view taken along line I-I' of FIG. 1, illustrating a semiconductor package according to some example embodiments of inventive concepts.

FIG. 4 is a cross-sectional view taken along line I-I' of FIG. 1, illustrating a semiconductor package according to some example embodiments of inventive concepts. For brevity of the description, components substantially the same as those in FIGS. 1 and 2 are allocated the same reference numerals thereto, and a detailed description thereof may be omitted.

Referring to FIG. 4, the semiconductor package 1000 may further include a heat dissipation structure 340 on the top surface 13 of the central zone 103b of the lower semiconductor chip 103. For example, the heat dissipation structure 340 may be disposed in the air gap AG. As shown in FIG. 4, the heat dissipation structure 340 may be formed spaced apart from the adhesive pattern 300. Alternatively, differently from that shown in FIG. 4, the heat dissipation structure 340 may be in contact with an inner wall of the adhesive pattern 300. The heat dissipation structure 340 may have a function to outwardly discharge heat from the lower semiconductor chip 103, and may further have a function to adhere the lower and upper packages 100 and 500 to each other. The heat dissipation structure 340 may include, for example, a thermal interface material (TIM).

Figure 5:
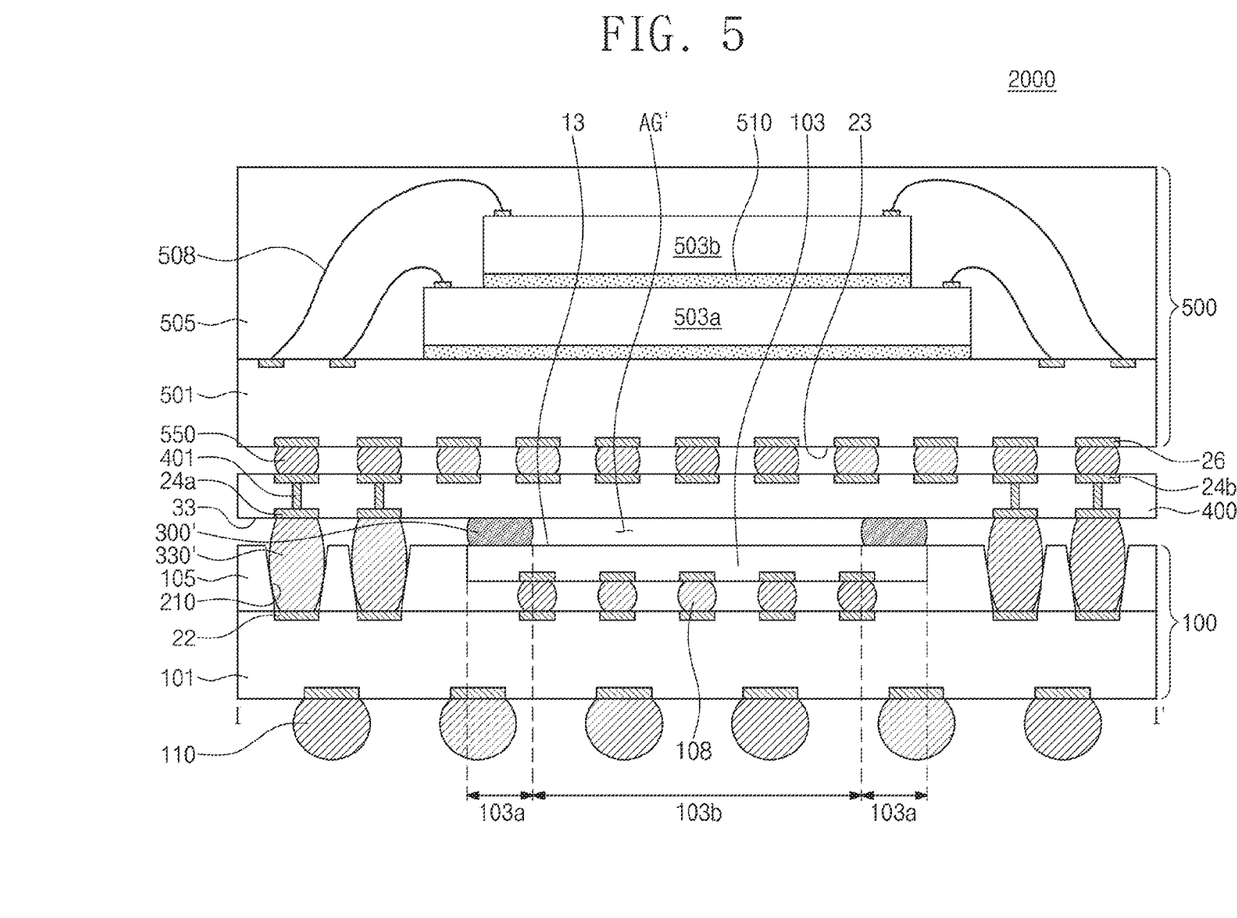
FIG. 5 is a cross-sectional view taken along line I-I' of FIG. 1, illustrating a semiconductor package according to some example embodiments of inventive concepts.

FIG. 5 is a cross-sectional view taken along line I-I' of FIG. 1, illustrating a semiconductor package according to some example embodiments of inventive concepts. For brevity of the description, components substantially the same as those in FIGS. 1 and 2 are allocated the same reference numerals thereto, and a detailed description thereof may be omitted.

Referring to FIG. 5, a semiconductor package 2000 may include a lower package 100, an upper package 500, an interposer substrate 400, interconnect terminals 330', and an adhesive pattern 300'.

The interposer substrate 400 may be disposed between the lower and upper packages 100 and 500. The interposer substrate 400 may electrically connect the lower and upper packages 100 and 500 to each other. The interposer substrate 400 may include a single insulation layer or multiple insulation layers. Lower conductive patterns 24a may be provided on a bottom surface 33 of the interposer substrate 400, and upper conductive patterns 24b may be provided on a top surface of the interposer substrate 400. The interposer substrate 400 may be provided therein with conductive vias 401, which electrically connect the upper conductive patterns 24b to the lower conductive patterns 24a.

In case that the lower semiconductor chip 103 and the upper semiconductor chips 503a and 503b are different kinds of semiconductor chips, the number and/or pitch of pads for electrically connecting between the lower semiconductor chip 103 and the lower substrate 101 may be different from the number and/or pitch of pads for electrically connecting between the upper semiconductor chips 503a and 503b and the upper substrate 501. This may be because that the number of signal terminals connecting between a semiconductor chip and a substrate may differ in accordance with a kind of semiconductor chip. The interposer substrate 400 may be used for good electrical connection between the lower and upper packages 100 and 500. The top surface of the interposer substrate 400 may be provided thereon with the upper conductive patterns 24b whose number and/or pitch are the same as those of upper pads 26 electrically connected to the upper semiconductor chips 503a and 503b. The bottom surface 33 of the interposer substrate 400 may be provided thereon with the lower conductive patterns 24a whose number and/or pitch are the same as those of the lower pads 22 electrically connected to the lower semiconductor chip 103.

The upper package 500 may further include second interconnect terminals 550 adhered to the bottom surface 23 of the upper substrate 501. The second interconnect terminals 550 may be in contact with the upper conductive patterns 24b of the interposer substrate 400 and may electrically connect the upper package 500 and the interposer substrate 400 to each other.

The interconnect terminals 330' may be disposed between the lower substrate 101 and the interposer substrate 400 and may combine the lower substrate 101 with the interposer substrate 400. The interconnect terminals 330' may be in contact with the lower pads 22 of the lower substrate 101 and the lower conductive patterns 24a of the interposer substrate 400. The interconnect terminals 330' may electrically connect between the lower package 100 and the interposer substrate 400.

The adhesive pattern 300' may be interposed between the top surface 13 of the lower semiconductor chip 103 and the bottom surface 33 of the interposer substrate 400. The adhesive pattern 300' may have a line shape, on the top surface 13 of the lower semiconductor chip 103, that extends along the edge 103a of the lower semiconductor chip 103. The adhesive pattern 300' may expose the top surface 13 of the central zone 103b of the lower semiconductor chip 103. The adhesive pattern 300' may define an air gap $AG^1$ provided between the lower semiconductor chip 103 and the interposer substrate 400.

Figure 6:
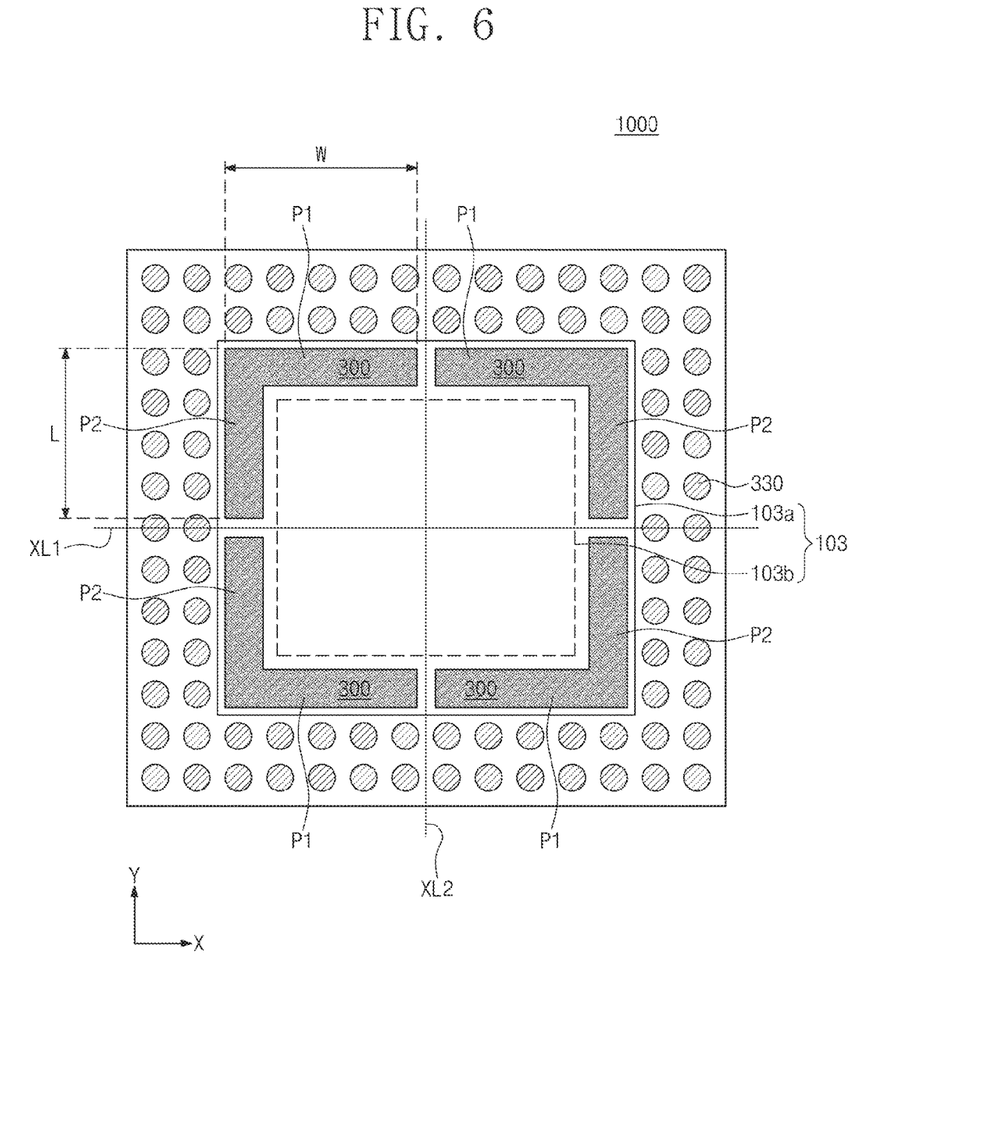
FIG. 6 is a plan view illustrating an example of an adhesive pattern discussed with reference to FIGS. 1 and 2.

FIG. 6 is a plan view illustrating an example of the adhesive pattern discussed with reference to FIGS. 1 and 2. For brevity of the description, components substantially the same as those in FIGS. 1 and 2 are allocated the same reference numerals thereto, and a detailed description thereof may be omitted. FIG. 2 is also referred to identify reference numerals not shown in FIG. 6.

Referring to FIGS. 2 and 6, adhesive patterns 300 may be interposed between the top surface 13 of the lower semiconductor chip 103 and the bottom surface 23 of the upper substrate 501. The adhesive patterns 300 may be arranged to face each other in the first direction X and the second direction Y. Each of the adhesive patterns 300 may be disposed adjacent to each of corners of the lower semiconductor chip 103. Each of the adhesive patterns 300 may include a first portion P1 and a second portion P2. The first portion P1 may extend in the first direction X along the edge 103a of the lower semiconductor chip 103. The second portion P2 may extend in the second direction Y from an end of the first portion P1 along the edge 103a of the lower semiconductor chip 103. Each of the adhesive patterns 300 may have a shape bent toward its adjacent one of the corners of the lower semiconductor chip 103. For example, the adhesive patterns 300 may have an L-shape. The adhesive patterns 300 may expose the top surface 13 of the central zone 103*b* of the lower semiconductor chip 103.

The first portion P1 of each adhesive pattern 300 may have a length W substantially the same as a length L of the second portion P2 of each adhesive pattern 300 (W=L). The length W of the first portion P1 may correspond to a width of each adhesive pattern 300, and the length L of the second portion P2 may correspond to a length of each adhesive pattern 300. The adhesive patterns 300 may be positioned line-symmetrically about a first axis XL1, which extends in the first direction X between the adhesive patterns 300, and a second axis XL2, which extends in the second direction Y between the adhesive patterns 300. For example, as shown in FIG. 3, the adhesive patterns 300 may be in contact with the top surface of the lower molding layer 105.

Figure 7:
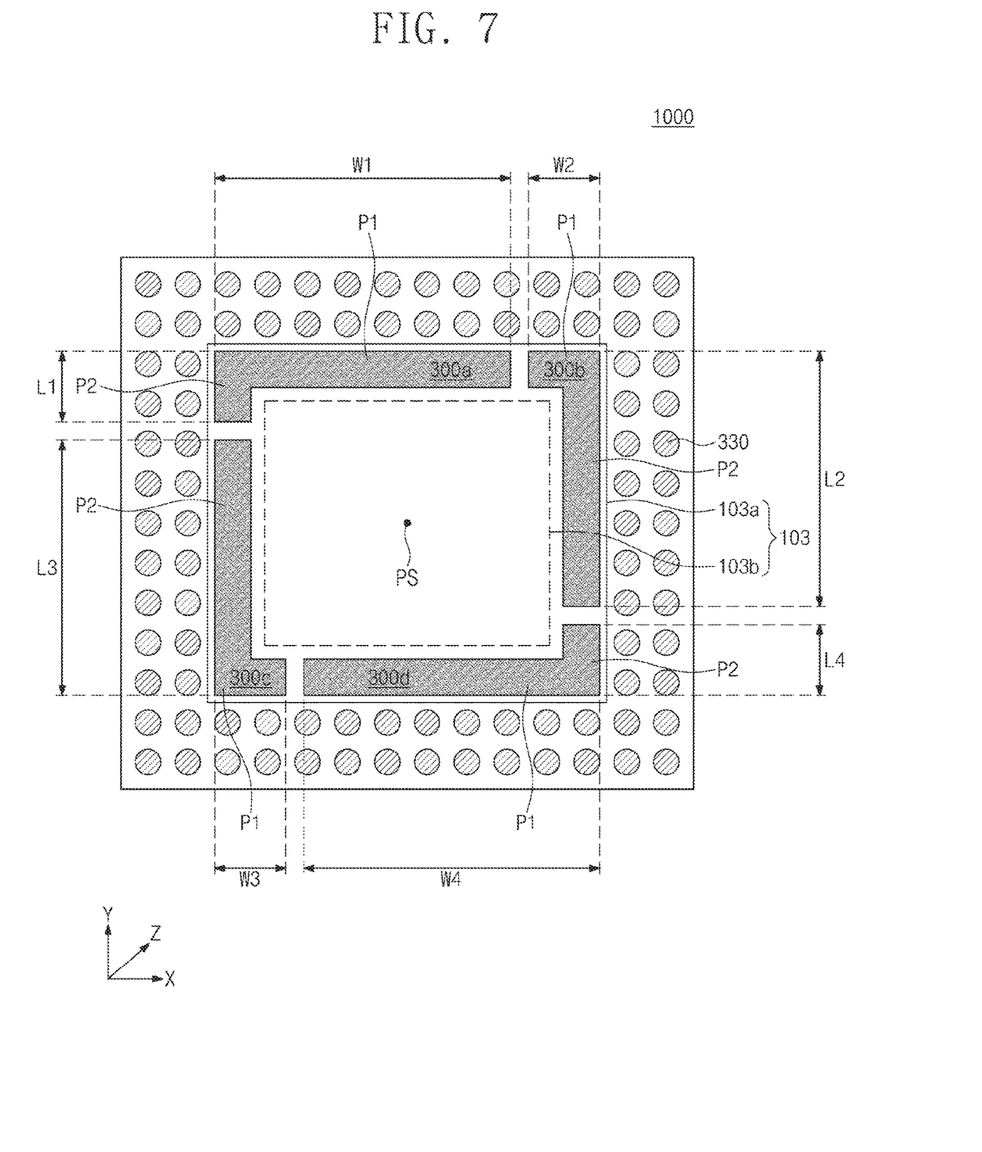
FIG. 7 is a plan view illustrating an example of an adhesive pattern discussed with reference to FIGS. 1 and 2.

FIG. 7 is a plan view illustrating an example of the adhesive pattern discussed with reference to FIGS. 1 and 2. For brevity of the description, components substantially the same as those in FIGS. 1, 2 and 6 are allocated the same reference numerals thereto, and a detailed description thereof may be omitted. FIG. 2 is also referred to identify reference numerals not shown in FIG. 7.

Referring to FIGS. 2 and 7, first, second, third and fourth adhesive patterns 300*a*, 300*b*, 300*c* and 300*d* may be interposed between the top surface 13 of the lower semiconductor chip 103 and the bottom surface 23 of the upper substrate 501. The first to fourth adhesive patterns 300*a* to 300*d* may be disposed adjacent to corresponding corners of the lower semiconductor chip 103. Each of the first to fourth adhesive patterns 300*a* to 300*d* may include a first portion P1 and a second portion P2. The first portion P1 may extend in the first direction X along the edge 103*a* of the lower semiconductor chip 103. The second portion P2 may extend in the second direction Y from an end of the first portion P1 along the edge 103*a* of the lower semiconductor chip 103. The first to fourth adhesive patterns 300*a* to 300*d* may expose the top surface 13 of the central zone 103*b* of the lower semiconductor chip 103.

The first and fourth adhesive patterns 300*a* and 300*d* may face each other in a third direction Z diagonal to the first and second directions X and Y, and the second and third adhesive patterns 300*b* and 300*c* may face each other in the third direction Z. For example, the first and fourth adhesive patterns 300*a* and 300*d* may be point-symmetric about a center PS of the lower semiconductor chip 103, and the second and third adhesive patterns 300*b* and 300*c* may be point-symmetric about the center PS of the lower semiconductor chip 103.

Lengths W1, W2, W3 and W4 of the first portions P1 included in the first to fourth adhesive patterns 300*a* to 300*d* may be different from lengths L1, L2, L3 and L4 of the second portions P2 included in the first to fourth adhesive patterns 300*a* to 300*d*. The lengths W1, W2, W3 and W4 of the first portions P1 included in the first to fourth adhesive patterns 300*a* to 300*d* may correspond to widths of the first to fourth adhesive patterns 300*a* to 300*d*, and the lengths L1, L2, L3 and L4 of the second portions P2 included in the first to fourth adhesive patterns 300*a* to 300*d* may correspond to lengths of the first to fourth adhesive patterns 300*a* to 300*d*.

For example, the length W1 of the first portion P1 included in the first adhesive pattern 300*a* may be substantially the same as the length W4 of the first portion P1 included in the fourth adhesive pattern 300*d*, and the length L1 of the second portion P2 included in the first adhesive pattern 300*a* may be substantially the same as the length L4 of the second portion P2 included in the fourth adhesive pattern 300*d* (W1=W4, L1=L4). The lengths W1 and W4 of the first portions P1 included in the first and fourth adhesive patterns 300*a* and 300*d* may be greater than the lengths L1 and L4 of the second portions P2 included in the first and fourth adhesive patterns 300*a* and 300*d*.

The length W2 of the first portion P1 included in the second adhesive pattern 300*b* may be substantially the same as the length W3 of the first portion P1 included in the third adhesive pattern 300*c*, and the length L2 of the second portion P2 included in the second adhesive pattern 300*b* may be substantially the same as the length L3 of the second portion P2 included in the third adhesive pattern 300*c* (W2=W3, L2=L3). The lengths W2 and W3 of the first portions P1 included in the second and third adhesive patterns 300*b* and 300*c* may be less than the lengths L2 and L3 of the second portions P2 included in the second and third adhesive patterns 300*b* and 300*c*. The lengths W1 and W4 of the first portions P1 included in the first and fourth adhesive patterns 300*a* and 300*d* may be greater than the lengths W2 and W3 of the first portions P1 included in the second and third adhesive patterns 300*b* and 300*c*. The lengths L1 and L4 of the second portions P2 included in the first and fourth adhesive patterns 300*a* and 300*d* may be less than the lengths L2 and L3 of the second portions P2 included in the second and third adhesive patterns 300*b* and 300*c*.

Figure 8:
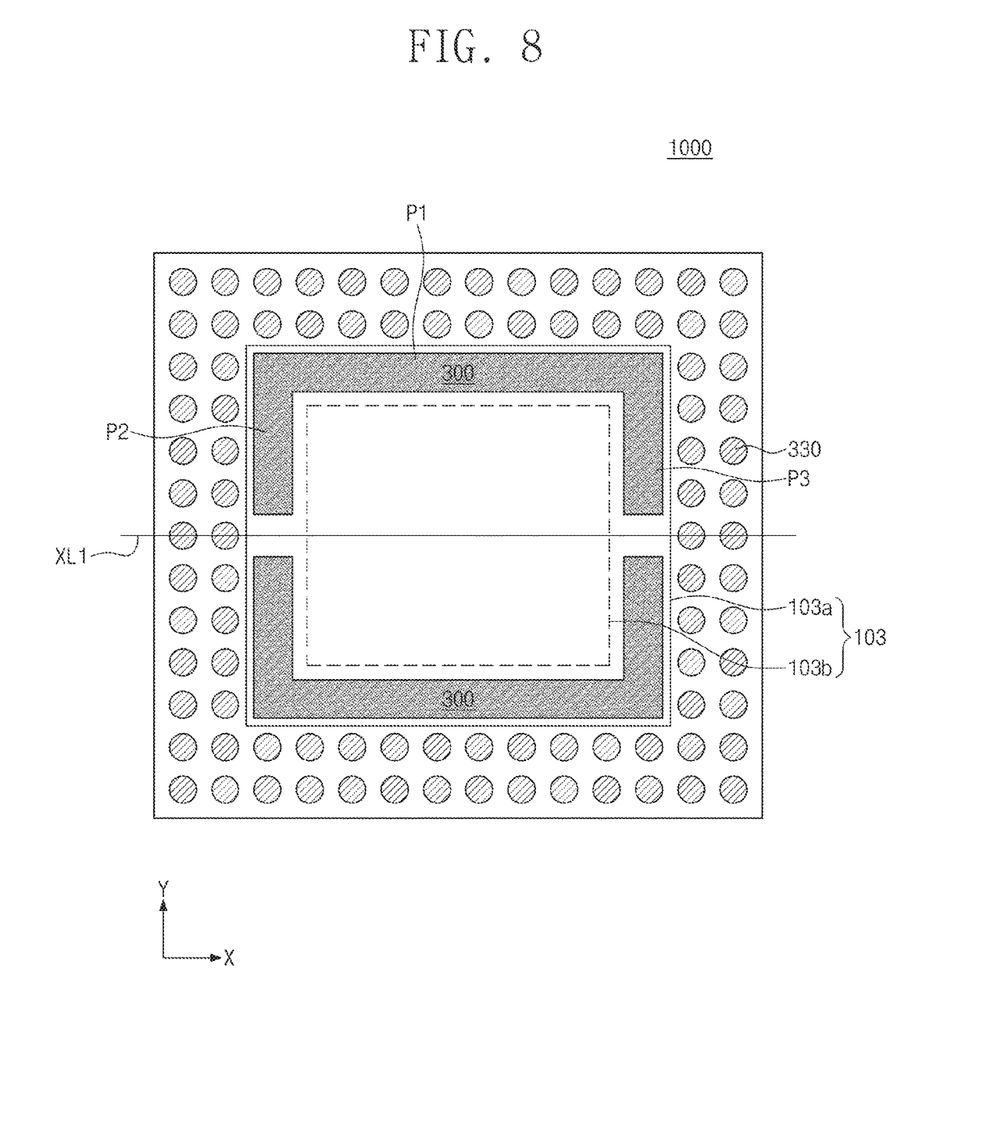
FIG. 8 is a plan view illustrating an example of an adhesive pattern discussed with reference to FIGS. 1 and 2.

FIG. 8 is a plan view illustrating an example of the adhesive pattern discussed with reference to FIGS. 1 and 2. For brevity of the description, components substantially the same as those in FIGS. 1, 2 and 6 are allocated the same reference numerals thereto, and a detailed description thereof may be omitted.

Referring to FIG. 8, adhesive patterns 300 may be disposed to face each other in the second direction Y. Each of the adhesive patterns 300 may include a first portion P1, a second portion P2, and a third portion P3. The first portion P1 may extend in the first direction X along the edge 103*a* of the lower semiconductor chip 103. The second portion P2 may extend in the second direction Y from an end of the first portion P1 along the edge 103*a* of the lower semiconductor chip 103. The third portion P3 may extend in the second direction Y from an opposite end of the first portion P1 along the edge 103*a* of the lower semiconductor chip 103. The adhesive patterns 300 may expose the top surface 13 of the central zone 103*b* of the lower semiconductor chip 103. For example, the adhesive patterns 300 may have a U-shape. The adhesive patterns 300 may be positioned line-symmetrically about a first axis XL1 extending in the first direction X between the adhesive patterns 300.

According to some example embodiments of inventive concepts, the adhesive pattern may be provided between the top surface of the lower semiconductor chip and the bottom surface of the upper substrate formed on the lower semiconductor chip so as to hold in position the lower and upper packages that have different thermal expansion coefficients from each other. The adhesive pattern may expose the top surface of the central zone of the lower semiconductor chip and be formed along the edge of the lower semiconductor chip. As a result, although a small amount of the adhesive pattern is formed on the top surface of the lower semiconductor chip, the adhesive pattern may efficiently fasten the lower and upper packages to each other and thus reduce and/or minimize the occurrence of crack on the interconnect terminals connected between the lower and upper packages.

Although some example embodiments of the inventive concepts have been described, inventive concepts are not limited thereto. It will be apparent to those skilled in the art that various substitution, modifications, and changes may be thereto without departing from the scope and spirit of the claims.

What is claimed is:

1. A semiconductor package, comprising:
a lower package including a first substrate and a semiconductor chip on the first substrate;
a second substrate on the lower package;
interconnect terminals between the first substrate and the second substrate; and
an adhesive pattern between a top surface of the semiconductor chip and a bottom surface of the second substrate,
the adhesive pattern extending along an edge of the semiconductor chip, and
the adhesive pattern exposing a top surface of a central zone of the semiconductor chip,
wherein the lower package further includes a molding layer contacting sidewalls of the semiconductor chip, and
the adhesive pattern contacts a top surface of the molding layer.

2. The semiconductor package of claim 1, wherein the adhesive pattern has a closed-loop shape or a ring shape.

3. A semiconductor package, comprising:
a first substrate;
a first semiconductor chip on a top surface of the first substrate;
a plurality of interconnect terminals on the top surface of the first substrate, the plurality of interconnect terminals arranged around the first semiconductor chip in a plan view;
an adhesive pattern on a top surface of the first semiconductor chip, the adhesive pattern extending along on at least part of an edge of the first semiconductor chip such that the adhesive pattern does not cover a central portion of the top surface of the semiconductor chip;
a second substrate on top of the adhesive pattern and the plurality of interconnect terminals; and
a heat dissipation structure on the central portion of the top surface of the first semiconductor chip.

4. The semiconductor package of claim 3, comprising:
a first package, wherein
the first package includes the first substrate and the first semiconductor chip on the first substrate,
the second substrate on the first semiconductor chip,
the interconnect terminals are between the first substrate and the second substrate,
the adhesive pattern is one adhesive pattern among adhesive patterns,
the adhesive patterns are between the top surface of the semiconductor chip and a bottom surface of the second substrate,
the adhesive patterns face each other,
each of the adhesive patterns includes a first portion and a second portion,
the first portion extends in a first direction along an edge of the semiconductor chip, and
the second portion extends in a second direction from an end of the first portion along the edge of the semiconductor chip, and
the second direction crosses the first direction.

5. The semiconductor package of claim 4, wherein a length of the first portion in each of the adhesive patterns is the same as a length of the second portion in each of the adhesive patterns.

6. The semiconductor package of claim 4, wherein, a length of the first portion in each of the adhesive patterns is different than a length of the second portion of each in the adhesive patterns.

7. The semiconductor package of claim 4, wherein
each of the adhesive patterns further includes a third portion, and
the third portion extends in the second direction from an opposite end of the first portion along the edge of the semiconductor chip.

8. The semiconductor package of claim 4, wherein the adhesive patterns expose a top surface of a central zone of the first semiconductor chip.

9. The semiconductor package of claim 4, wherein
the first semiconductor chip includes corners, and
the adhesive patterns are adjacent to each of the corners of the first semiconductor chip.

10. The semiconductor package of claim 4, wherein the adhesive patterns are point-symmetric about a center of the first semiconductor chip.

11. The semiconductor package of claim 4, wherein the adhesive patterns are positioned line-symmetrically about an axis passing between the adhesive patterns.

12. The semiconductor package of claim 3, wherein the adhesive pattern is a contiguous layer extending along the edge of the first semiconductor chip.

13. The semiconductor package of claim 3, wherein
the adhesive pattern at least partially surrounds the heat dissipation structure in the plan view.

14. The semiconductor package of claim 3, wherein the adhesive pattern includes a first portion and a second portion that are separated from each other.

15. The semiconductor package of claim 3, further comprising:
a molding layer on the first substrate, wherein
the molding layer defines openings,
the interconnect terminals extend through the openings to electrically connect the first substrate to the second substrate.

16. A semiconductor package, comprising:
a lower package including a first substrate and a semiconductor chip on the first substrate;
a second substrate on the lower package;
interconnect terminals between the first substrate and the second substrate; and
an adhesive pattern between a top surface of the semiconductor chip and a bottom surface of the second substrate, the adhesive pattern extending along an edge of the semiconductor chip, and the adhesive pattern exposing a top surface of a central zone of the semiconductor chip; and at least one of
a heat dissipation structure on the top surface of the central zone of the semiconductor chip, or
an upper package on the second substrate, wherein the upper package includes a third substrate, second interconnect terminals between the third substrate and the second substrate, and a second semiconductor chip on the third substrate.

17. The semiconductor package of claim 16, wherein the semiconductor package includes the heat dissipation structure on the top surface of the central zone of the semiconductor chip.

18. The semiconductor package of claim 16, wherein the semiconductor package includes the second semiconductor chip on the second substrate.

19. The semiconductor package of claim 18, wherein the semiconductor chip is a semiconductor logic chip and the second semiconductor chip is a semiconductor memory chip.

20. The semiconductor package of claim 16, wherein the semiconductor package includes the upper package on the second substrate, and
   the upper package includes, the third substrate, the second interconnect terminals between the third substrate and the second substrate, and the second semiconductor chip on the third substrate.

* * * * *